(12) United States Patent
Balakrishnan et al.

(10) Patent No.: US 7,302,626 B2
(45) Date of Patent: Nov. 27, 2007

(54) TEST PATTERN COMPRESSION WITH PATTERN-INDEPENDENT DESIGN-INDEPENDENT SEED COMPRESSION

(75) Inventors: Kedarnath Balakrishnan, Plainsboro, NJ (US); Seongmoon Wang, Plainsboro, NJ (US); Srimat T. Chakradhar, Manalapan, NJ (US)

(73) Assignee: NEC Laboratories America, Inc., Princeton, NJ (US)

( * ) Notice: Subject to any disclaimer, the term of this patent is extended or adjusted under 35 U.S.C. 154(b) by 231 days.

(21) Appl. No.: 11/095,222

(22) Filed: Mar. 31, 2005

(65) Prior Publication Data

US 2006/0112320 A1     May 25, 2006

Related U.S. Application Data

(60) Provisional application No. 60/629,827, filed on Nov. 19, 2004.

(51) Int. Cl.
*G01R 31/28*    (2006.01)
(52) U.S. Cl. ........................................ 714/738; 714/732
(58) Field of Classification Search ...................... None
See application file for complete search history.

(56) References Cited

U.S. PATENT DOCUMENTS

| | | | |
|---|---|---|---|
| 5,991,909 A * | 11/1999 | Rajski et al. ............... | 714/729 |
| 6,041,429 A * | 3/2000 | Koenemann ................ | 714/738 |
| 6,272,653 B1 * | 8/2001 | Amstutz ..................... | 714/724 |
| 6,684,358 B1 * | 1/2004 | Rajski et al. ............... | 714/739 |
| 6,950,974 B1 * | 9/2005 | Wohl et al. ................. | 714/733 |
| 7,093,175 B2 * | 8/2006 | Rajski et al. ............... | 714/728 |

FOREIGN PATENT DOCUMENTS

EP      481097 A  *  4/1992

OTHER PUBLICATIONS

Hellebrand, S. et al., "Built-In Test for Circuits with Scan Based on Reseeding of Multiple-Polynomial Linear Feedback Shift Registers," IEEE Transactions on Computers, vol. 44, No. 2, Feb. 1995, pp. 223-233.*
Decompression of test data using variable-length seed LFSRs Zacharia, N.; Rajski, J.; Tyszer, J.;□□VLSI Test Symposium, 1995. Proceedings., 13th IEEE Apr. 30-May 3, 1995 pp. 426-433.*

* cited by examiner

*Primary Examiner*—Cynthia Britt
(74) *Attorney, Agent, or Firm*—Joseph Kolodka

(57) ABSTRACT

The present invention is directed to a logic testing architecture with an improved decompression engine that compresses the seeds of a linear test pattern generator in a manner that is independent of the test pattern set.

11 Claims, 7 Drawing Sheets

(A)

(B)

```
while (pattern_solved < num_patterns)
    prev_seed = seed[last_pattern];
    foreach unsolved pattern j
        dist=ESTIMATE_DISTANCE(prev_seed,j)
        if (dist < mindist)
            mindist = dist;
            closest_pattern = j;
    done
    FIND_CLOSEST_SEED(prev_seed,closest_pattern)
    pattern_solved++;
    last_pattern = closest_pattern;
done
``` shift register partitions 921- 924

TEST PATTERN COMPRESSION WITH PATTERN-INDEPENDENT DESIGN-INDEPENDENT SEED COMPRESSION

CROSS-REFERENCE TO RELATED APPLICATIONS

This application claims the benefit of U.S. Provisional Application 60/629,827, entitled "TEST PATTERN COMPRESSION WITH PATTERN-INDEPENDENT DESIGN-INDEPENDENT SEED COMPRESSION," filed on Nov. 19, 2004, the contents of which are incorporated by reference herein.

BACKGROUND OF THE INVENTION

The present invention is related to testing of logic circuit designs, in particular in the context of compression of test patterns for logic testing.

Testing of complicated digital logic circuits requires the generation of large test patterns. Unfortunately, the sizes of scan test patterns for today's large designs can be even larger than the sizes of typical tester memory. This necessitates multiple loading of test patterns during a test application and, in turn, increases test application time and test cost. The oversized test pattern set problem is even more severe in delay testing, which has become a necessary test procedure for deep-sub micron chips. Delay test set sizes are often significantly larger than memory capacities of inexpensive testers. Test set sizes and test application times are major factors that determine the test cost of an integrated circuit.

One technique for addressing the issue is to compress the test data. Most prior art test data compression techniques proposed and developed for commercial use achieve compression by storing the seeds of a linear test pattern generator (e.g., such as a linear feedback shift register (LFSR) or a linear hybrid cellular automata (LHCA)) instead of the whole pattern. See B. Köinemann, "LFSR-coded Test Patterns for Scan Designs," *Proc. Of European Test Conf.*, pp. 237-42 (1991). The test pattern is generated from the seed by first loading the seed and then running the linear test pattern generator for several cycles. The seeds are obtained by solving a system of linear equations. Compression is achieved because many of the bits in the test patterns are, in fact, unspecified ("don't cares"). FIG. 1 shows the architecture of typical reseeding schemes, where the linear test pattern generator is loaded with an m-bit seed by the tester and is then run in autonomous mode to produce an n-bit scan test pattern. The generator can be directly connected to the scan chain in the case of a single scan chain in the design or connected to multiple scan chains using a phase shifter. It has recently been suggested to further compress the seeds of the linear test pattern generator by using statistical coding. See C. V. Krishna and N. A. Touba, "Reducing Test Data Volume Using LFSR Reseeding with Seed Compression," *Proc. International Test Conference*, pp. 321-30 (2002). Seeds of the LFSR are chosen such that they can be encoded using a statistical code. Unfortunately, a statistical decoder is dependent on the test set and, if the test pattern set is modified (which may happen due to last minute design changes), the design of the algorithm as well as the statistical decoder need to be changed. It has also been proposed to encode the seeds of the LFSR by the number of clock cycles the LFSR needs to reach the new seed from the current seed. See A. Al-Yamani and E.J. McCluskey, "Seed Encoding with LFSRs and Cellular Automata," in *Proc. Design Automation Conference*, pp. 560-65 (2003). The cost of the scheme, however, is the time required to reach the intended seed from the current seed, which for large LFSRs will increase the test application time enormously. The "reseeding" control circuit again depends on the test pattern set.

SUMMARY OF INVENTION

The present invention is directed to a logic testing architecture that is capable of compressing the seeds of a test pattern generator in a manner that is independent of the test pattern set. In accordance with an embodiment of the present invention, the decompression engine comprises a test pattern generator, for example, a linear test pattern generator, that is seeded from one or more shadow registers. The shadow register holds the current seed; the next seed is advantageously selected from the solution space in a manner that optimizes the performance of the architecture. For example, where the seeds are compressed by an arbitrary compression strategy, the next seed is selected from the possible seeds in the solution space so as to provide the best compression performance. In accordance with another aspect of the invention, it is advantageous to compress the seeds for the test pattern generator by storing only a representation of the current seed that is a function of one or more of the previous seeds. The representation can be utilized to modify the contents of the shadow register and generate the next seed. For example, the representation can encode the difference between the current seed and the previous seed. This scheme can be combined with the previous aspect of the invention, for example, by selecting seeds that minimize the differences between consecutive seeds and, thereby, further improve compression results. In accordance with one embodiment, an address decoder is utilized to modify the current seed based on the representation provided by the tester of the differences between the current seed and the selected next seed. In accordance with another embodiment, the contents of the linear test pattern generator are combined with signals from a tester channel at an exclusive or (XOR) gate so as to construct the new seed. In accordance with another embodiment, a plurality of shadow registers can be used to load portions of the seed in parallel into the linear test pattern generator, thereby reducing the time taken to load the seed into the generator. In accordance with another embodiment, the shadow register is loaded from the tester by using a counter and a comparator. In accordance with another embodiment, the shadow register is partitioned into smaller partitions and can be loaded serially by using a counter to select the partition to load. Another embodiment is to reset the counter internally so that only the difference in positions that need to be changed are stored in the tester.

In accordance with another embodiment, the new seed can be generated from the last state of the linear test pattern generator, thereby removing any need for a shadow register. It is straightforward to compute the last state after scan loading, given any seed of the linear test pattern generator. Thus, the seeds can be compressed by storing a compressed representation that is a function of this last state. For example, the compressed representation of the seed can encode the differences between the seed and the last state of the linear test pattern generator.

The present invention advantageously can be used on top of any conventional test pattern compression technique. The compression achieved by the present invention is a multiplicative factor to the compression from the previous linear test pattern generator reseeding stage. Moreover, unlike prior art approaches, the present invention is independent of the test pattern set. There is no need to redesign the decompressor hardware for different test pattern sets, and, hence, there is no need to change the decompressor hardware for different designs. These and other advantages of the invention will be apparent to those of ordinary skill in the art by reference to the following detailed description and the accompanying drawings.

DETAILED DESCRIPTION

Figure 1:
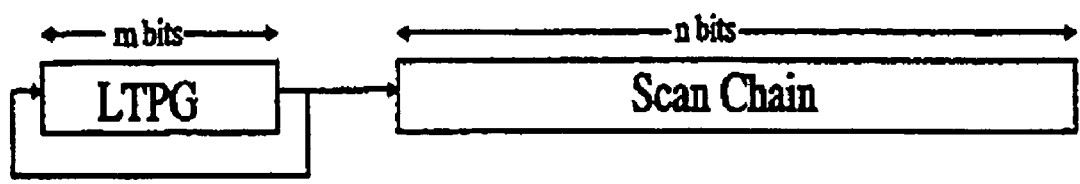
FIG. 1 is an illustration of prior art decompression architecture.
Figure 1:
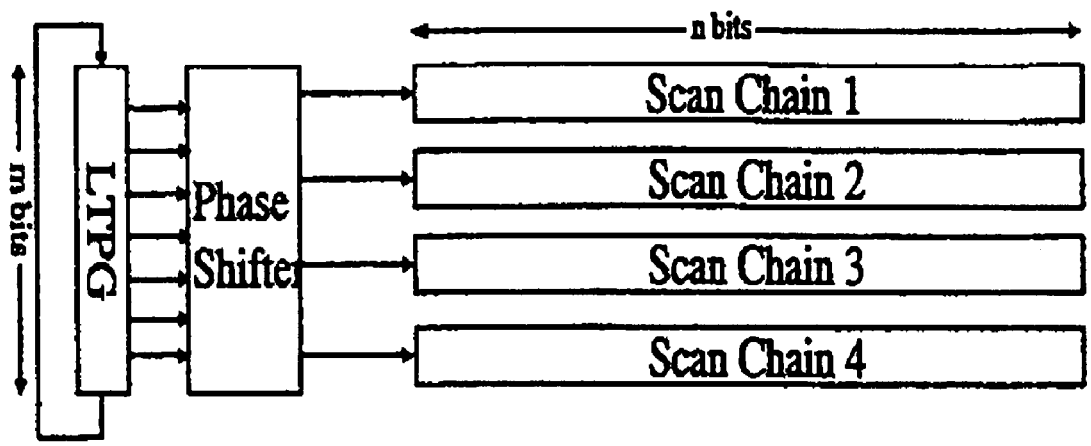
Figure 2:
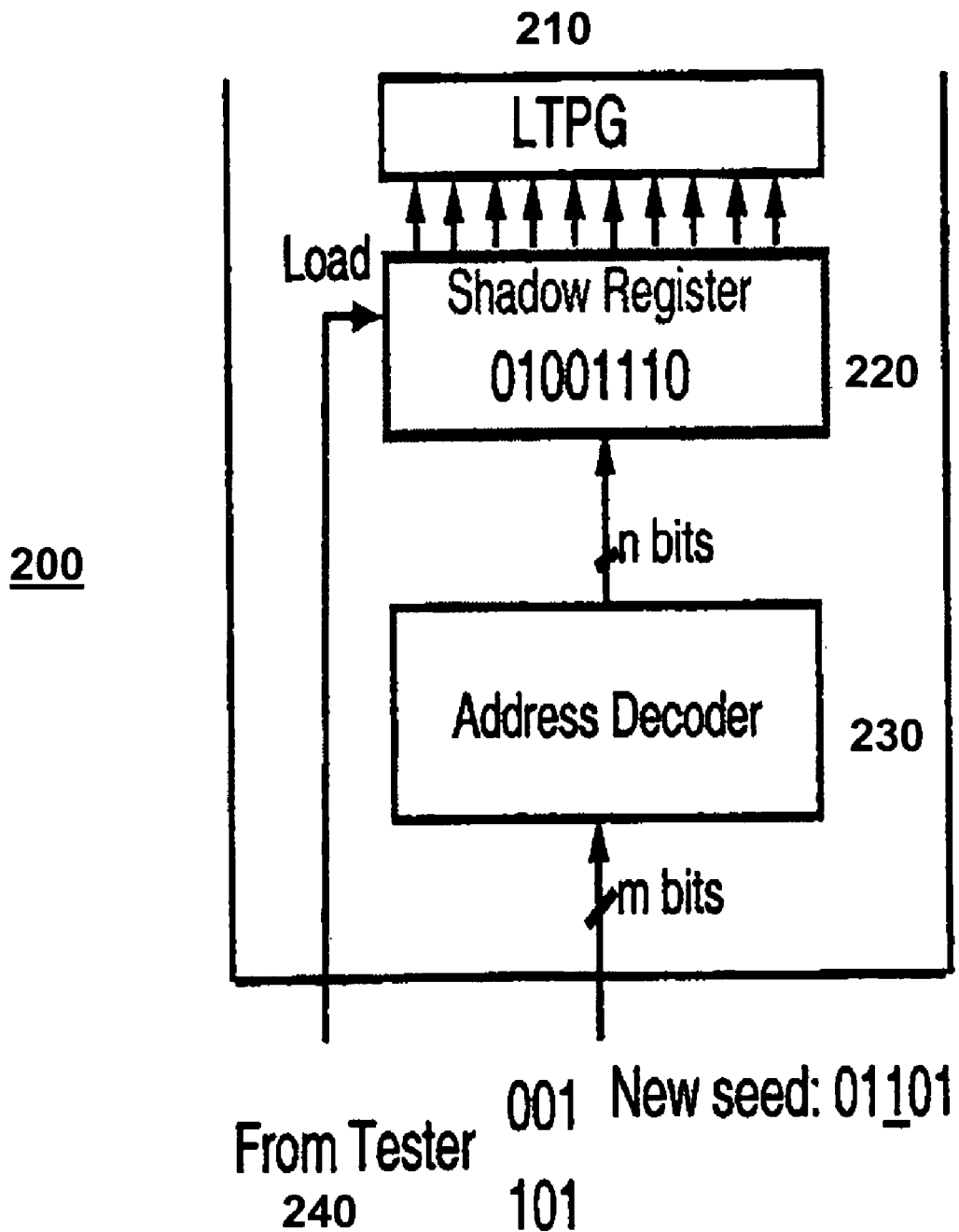
FIG. 2 is a diagram illustrating a decompression architecture in accordance with an embodiment of the present invention.

FIG. 2 is a diagram illustrating a decompression architecture 200 in accordance with an embodiment of the present invention. It is assumed that a linear decompression scheme is utilized, and that the architecture 200 comprises a linear test pattern generator (LTPG) 210. The specific implementation of the linear test pattern generator 210 is not relevant for the present invention. Rather than load a seed directly from a tester 240 into the linear test pattern generator 210, the architecture 200 has a shadow register 220 which is used to store the current seed. The linear test pattern generator 210 is loaded from the shadow register 220.

When a new seed is to be loaded from the tester 240, the shadow register 220 is loaded in the following manner, in accordance with an embodiment of the present invention. Instead of storing the whole seed at the tester 240, compression is further obtained by storing a representation of the differences between consecutive seeds in the tester and, in particular, selecting consecutive seeds in such a manner so as to minimize these differences between consecutive seeds. The architecture, thereby, takes advantage of the fact that in typical test patterns, many bits are unspecified ("don't cares"). The number of stages or size of the LTPG 210 is proportional to the maximum number of specified bits ($s_{max}$) in any test cube (a test pattern with unspecified or "don't care" bits) in the test set. Since most cubes have specified bits much smaller than $s_{max}$, the system of equations for these test cubes have multiple solutions. This solution space, in accordance with this aspect of the invention, can be leveraged to select a solution that minimizes the differences between consecutive seeds and, thus, further improves compression of the test patterns.

As depicted in FIG. 2, the current seed in the shadow register 220 is "01001110". The solution space defined by the system of linear equations for the decompression architecture 200 will typically allow for multiple candidates for the next seed. The number of candidate solutions for the system is determined by the number of what are referred to as "free variables" in the system, the number of solutions being equal to $2^{(\# \text{ free variables})}$.

Figures 3, 4:
FIG. 3 illustrates the process of identifying possible seeds for the shadow register.
FIG. 4 is pseudo-code illustrating an embodiment of the process of selecting seeds.

For example, consider the illustrative system of linear equations shown in FIG. 3. The system of linear equations can be readily solved by a number of known methods, including Gaussian elimination. Gaussian elimination involves performing row operations on each row of the original matrix and the corresponding element of the vector on the right hand side—the goal being to reduce the system to a form that is easily solvable. After Gaussian elimination, the columns of the matrix can be divided into two categories, "pivot columns" and "free variables columns". Pivot columns form an identity matrix and have a single occurrence of "1" in them. For the example depicted in FIG. 3, the first, second, and third columns are pivot columns while the fourth column is a free variable column. The rows that have pivot columns are referred to as pivot rows while the rest of the rows are linearly dependent rows. Linearly dependent rows have all elements as zeros. This system of equations is solvable if and only if the values on the right hand side corresponding to all of the linearly dependent rows are zeros. The example depicted in FIG. 3 is solvable, because the fourth row is linearly dependent and the corresponding value on the right hand side is zero. There is only one free variable and, hence, there are two possible solutions. The solutions in terms of $(x_1, x_2, x_3, x_4)$ are (1, 0, 1, 0) and (0, 1, 0, 1). If the previous seed is (0, 1, 0, 0) then, in order to maximize compression, it is advantageous to choose the solution (0, 1, 0, 1) since the difference between this solution and the previous seed is only in one bit. If (1, 0, 1, 0) had been chosen as the solution, on the other hand, then three bit positions would need to be stored (the difference being in the three bits).

Thus, with reference again to FIG. 2, it is advantageous to select a next seed in the solution space which is close in form to "01001110". In the example depicted in FIG. 2, the new seed selected is "01101100" which differs from the current seed in only two bit positions. The two seeds differ in bit positions "1" and "5". For each seed, the tester need only store a representation of the difference between the two seeds. In the embodiment depicted in FIG. 2, an address decoder 230 is utilized to read the representation and then modify the current seed in the shadow register 220 to get the new seed. For example, one advantageous representation of the differences between consecutive seeds is shown in FIG. 2. For each n bit seed, the tester can store (i) the number of bits that are different from the previous seed, which are loaded into a counter ($m = \log_2 n$ bits) on the tester; and (ii) the addresses of these bits (m bits) which are loaded into the address decoder 230 one-by-one. In the example depicted in FIG. 2, the tester stores the values "001" (binary for bit position "1") and "101" (binary for bit position "5"). The address decoder 230 uses these values to modify the bits in the current seed in the shadow register 220 so as to reflect the new seed value.

FIG. 4 shows pseudo-code illustrating the process of selecting seeds while reordering the test patterns. The next pattern is chosen to be the one that is "closest" to the previous pattern in accordance with some advantageous distance metric that optimizes the compression strategy utilized. For example, and without limitation, the "closest" seed can be the seed with the fewest number of bits that need to be modified. The distance between the solutions for a pattern "j" and the previous seed can be estimated using the function "ESTIMATE_DISTANCE". For the closest pattern as determined in the previous step, the function "FIND_ CLOSEST_SEED" is used to find the seed which requires the fewest number of flips from the previous seed.

Figure 5:
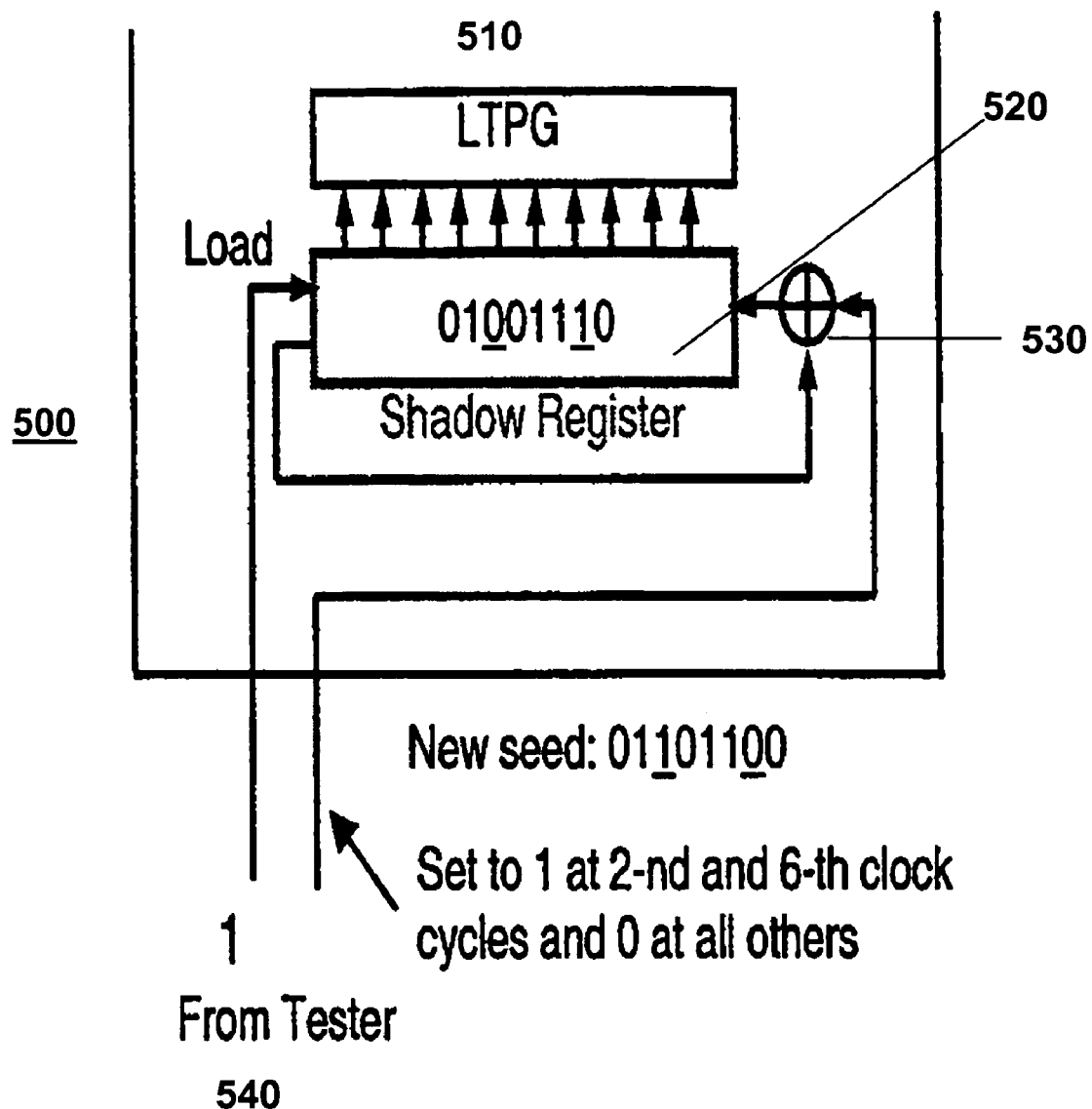
FIG. 5 is a diagram of a decompression architecture in accordance with another embodiment of the present invention.

FIG. 5 shows an alternative embodiment of the present invention. In the scheme illustrated by FIG. 5, the decompression architecture 500 comprises a linear test pattern generator 510, a shadow register 520, and an exclusive or (XOR) gate 530. Again, the current seed in the shadow register 520 is "01001110". The new seed is selected from the specific solution space so as to minimize the differences between the current seed and the new seed, as discussed above. The new seed of "01101100" is constructed from the previous seed by using the shadow register 520 and the XOR gate 530. A signal channel is provided from the tester which is used to indicate the bit positions where the current and the next seed differ. In the example depicted in FIG. 5, the channel is set to a "1" at the second and sixth clock cycles and "0" at all others. This corresponds to the bit locations where the two seeds differ and will generate the necessary changes in the current seed when applied to the XOR gate 530. This implementation has an advantage over the implementation shown in FIG. 2 in that it requires less hardware.

Figure 6:
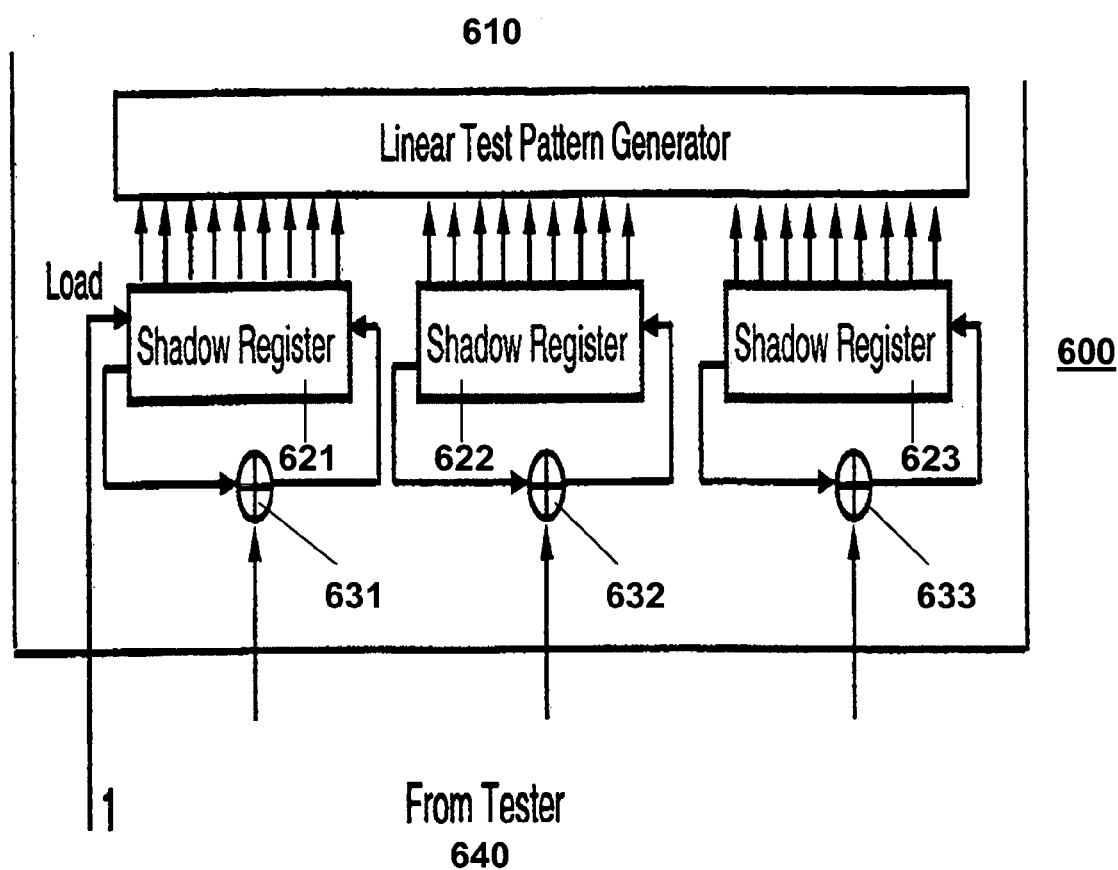
FIG. 6 is a diagram of a decompression architecture in accordance with another embodiment of the present invention.

FIG. 6 shows another alternative embodiment that is particularly advantageous for a long linear test pattern generator 610. The architecture 600 comprises a plurality of shadow registers, illustratively three shadow registers 621, 622, 623. Each shadow register 621, 622, 623 has a corresponding mechanism for loading the next seed, here shown as XOR gates 631, 632, 633. As in the example shown in FIG. 5, the next seeds for each shadow register 621, 622, 623 is constructed by applying the previous seed to one of the three testing channels, the testing channels indicating the bit positions where the current and next seeds differ for each respective shadow register. This embodiment advantageously reduces the number of cycles it takes to load the shadow registers with the portions of the new seed.

Figure 7:
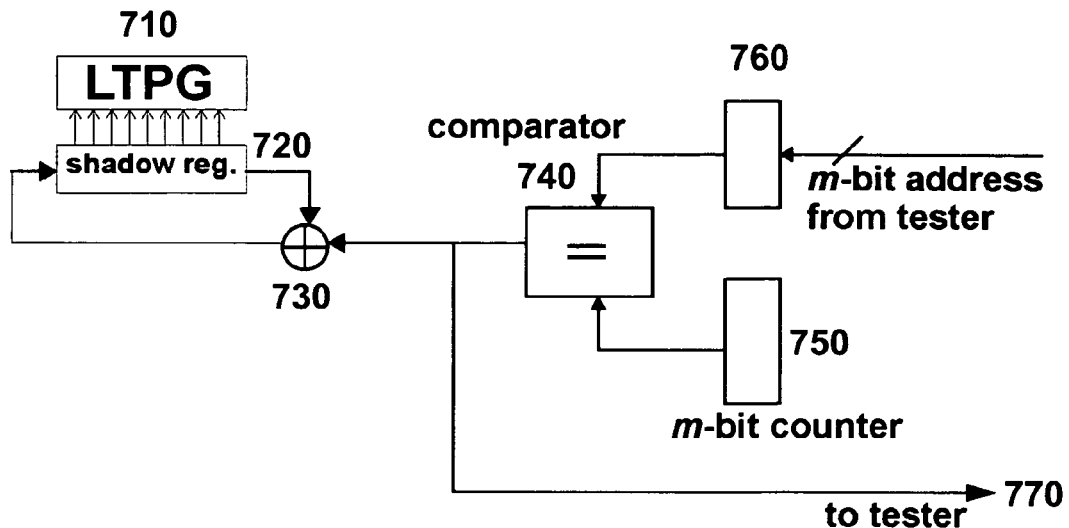
FIG. 7 is a diagram of a decompression architecture in accordance with another embodiment of the present invention.

FIG. 7 shows another alternative embodiment of the present invention. The decompression architecture comprises a register 760 to which the address is loaded from the tester, a counter 750 that is clocked with the same clock as the shift register 720, a comparator 740 that is set to a 1 when the values in the counter 750 and register 760 loaded by the tester are same and an XOR gate 730 that is used to modify the contents of the current seed in the test pattern generator 710 to get the new seed. The tester observes the output of the comparator 740 and loads the register 760 with a location of the next bit that need to be changed when the output of the comparator 740 is set to a 1. Suppose that the current seed is "01110110" and the new seed is "00111100". Locations of bits that need to be changed are 001, 011, and 110. The counter 750 is initialized to 0 before the current seed is changed. The register 760 is loaded with the location of the first bit to be changed, i.e., 001. At the next clock cycle, the count is incremented to 001 and the output of the comparator 740 is set to a 1. The 1 at the output of the shadow register 720 is flipped to 0 by the XOR gate 730 before it is fed back. After the tester observes 1 at the output comparator, it loads the register 760 with 011, the location of the second bit to be changed. After two more clock cycles, the counter 750 becomes 011 and the output of the comparator 740 is set to a 1 again. The 0 at the output of the shadow register 720 is flipped by the XOR gate 730. The tester loads the register 760 with 011. After three more clock cycles, the output of the comparator 740 is set to a 1 and the 1 at the output of the shadow register 720 is flipped to 0. After one more clock cycle, the shadow register 720 is fully reloaded with the new seed "00111100". This embodiment reduces the hardware overhead required to implement the present invention since it does not require the decoder, which requires large hardware for implementation.

Figure 8:
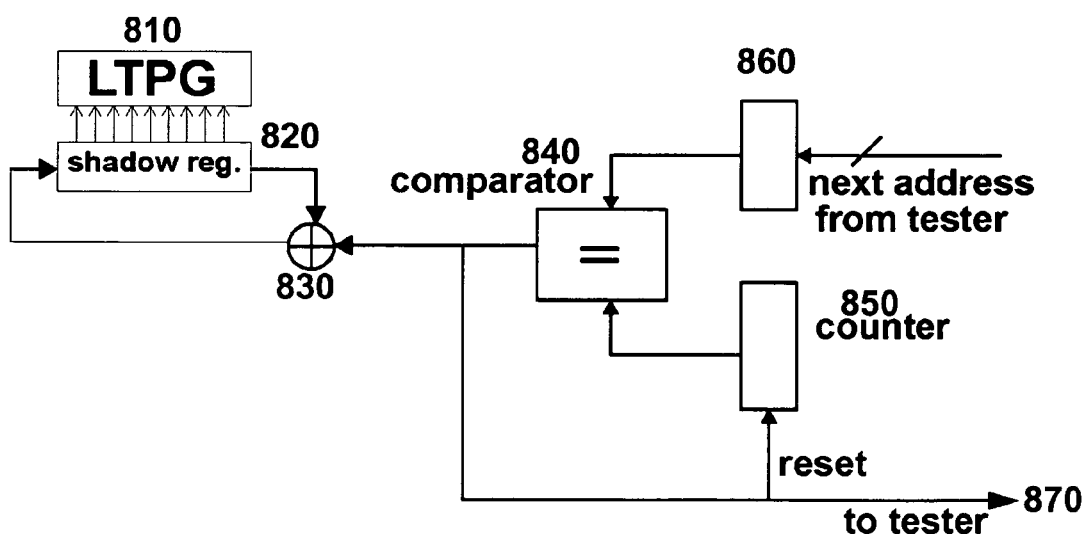
FIG. 8 is a diagram of a decompression architecture in accordance with another embodiment of the present invention.

FIG. 8 shows another embodiment of the present invention. In this embodiment, the register 860 is loaded with distances between consecutive bits instead of absolute locations of bits that need to be changed. The counter 850 is reset by the output of the comparator 840. For the example seeds described in the preceding paragraph, this embodiment needs to store 01, 10, and 11 bits instead of 001, 011, and 110. This has the advantage of increasing the compression since the tester needs to store only the difference between consecutive bits that need to be changed rather than complete locations. Since it requires smaller sizes of comparator, counter, and register, it can further reduce hardware overhead over the embodiment of the preceding paragraph.

Figure 9:
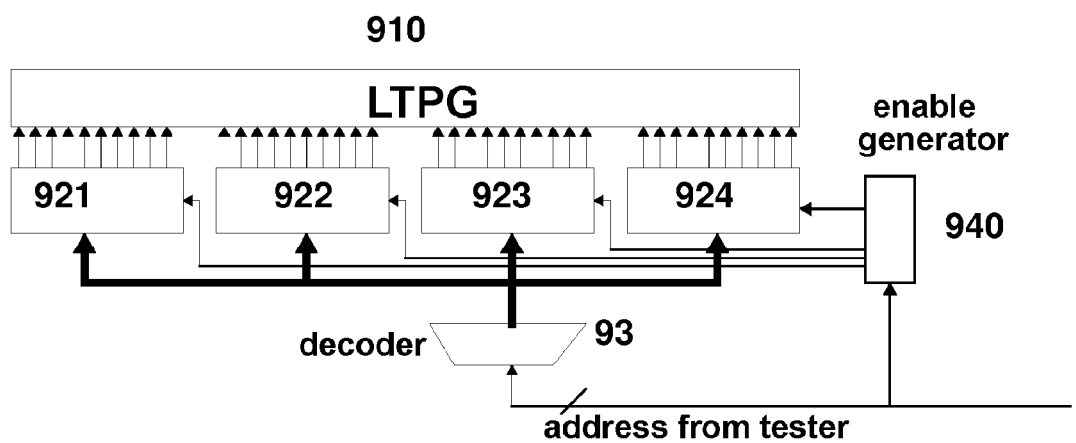
FIG. 9 is a diagram of a decompression architecture in accordance with another embodiment of the present invention.

FIG. 9 shows another embodiment of the present invention that is particularly advantageous for a long linear test pattern generator. The shift register is partitioned into several partitions, e.g. 921, 922, 923, 924 in FIG. 9, and each partition is loaded separately. An enable signal for each partition is generated by the enable generator 940 which reads the input address from the tester. The address is decoded by an address decoder 930 which indicates whether the current bit position in the linear test pattern generator 910 needs to be modified. The number of stages in each partition should not be $2^n$, where n is a natural number. The address with all 1's changes the content of the enable generator 940 to enable the next partition. Suppose that the linear pattern generator 910 need 28 stages which are partitioned into four 7-stage partitions. Before the old seed of each partition is changed to the new seed by using the embodiment, the enable generator 940 is initialized to 1000 to enable the first partition. The other three partitions are disabled, i.e., they hold the values currently stored in the partitions. The tester sends addresses of the bits in the first partition that need to be changed. When all necessary bits are changed, then the tester sends address 111. When the enable generator 940 receives address 111, the content of the enable generator 940 is changed to 0100 to enable the second partition. This is repeated until all bits that need to be changed are flipped. It should be noted that the embodiment shown in FIG. 8 advantageously requires only a 3-bit address signal. In contrast, the embodiment shown in FIG. 2 would need at least a 5-bit address signal to control a shadow register with 28 stages. Thus, this embodiment increases the compression and reduces hardware overhead.

It should be noted that the shadow register depicted in the embodiments above is not necessary for the operation of the invention. In accordance with another embodiment, the new seed can be generated from a last state of the linear test pattern generator, thereby removing any need for a shadow register. The last state can be read directly from the test pattern generator and modified to generate the new seed using any of the above-described techniques, including using an address decoder, XOR logic, a comparator, etc. It is straightforward to compute the last state after scan loading, given any seed of the linear test pattern generator. Thus, the seeds can be compressed by storing a compressed representation that is a function of this last state. For example, the compressed representation of the seed can encode the differences between the seed and the last state of the linear test pattern generator. It is anticipated that such an embodiment might not provide as good compression results as using a shadow register, although the embodiment does give a good area/compression tradeoff.

While exemplary drawings and specific embodiments of the present invention have been described and illustrated, it is to be understood that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention as set forth in the claims that follow and their structural and functional equivalents. As but one of many variations, it should be understood that test pattern generators other than linear feedback shift registers can be readily utilized in the context of the present invention.

What is claimed is:

1. A method of generating a test pattern for a logic testing architecture, the method comprising:
    storing one or more previous seed values;
    decoding a compressed representation of a current seed which is encoded as a function of the one or more previous seeds; and
    seeding a test pattern generator with the decoded current seed, thereby generating a test pattern for the logic testing architecture, wherein the compressed representation of the current seed encodes differences between the current seed and the one or more previous seeds.

2. The method of claim 1, wherein the current seed is selected from a solution space of possible seed values for the test pattern generator which minimizes the differences between the current seed and the one or more previous seeds.

3. The method of claim 1, wherein the one or more previous seed values are stored in a shadow register and wherein the current seed is decoded by modifying the shadow register.

4. The method of claim 1, wherein the test pattern generator is a linear test pattern generator.

5. The method of claim 4, wherein the linear test pattern generator is a linear feedback shift register.

6. The method of claim 4, wherein the linear test pattern generator is a linear hybrid cellular automata.

7. A method of generating a test pattern for a logic testing architecture, the method comprising:
    decoding a compressed representation of a seed for a test pattern generator which is encoded as a function of a last state of the test pattern generator; and
    seeding the test pattern generator with the decoded seed, thereby generating a test pattern for the logic testing architecture, wherein the compressed representation of the current seed encodes differences between the seed and the last state of the test pattern generator.

8. The method of claim 7, wherein the test pattern generator is a linear test pattern generator.

9. The method of claim 8, wherein the linear test pattern generator is a linear feedback shift register.

10. The method of claim 8, wherein the linear test pattern generator is a linear hybrid cellular automata.

11. A method of generating a test pattern for a logic testing architecture, the method comprising:
    storing one or more previous seed values;
    decoding a compressed representation of a current seed which is encoded as a function of the one or more previous seeds; and
    seeding a test pattern generator with the decoded current seed, thereby generating a test pattern for the logic testing architecture, wherein the current seed is selected from a solution space of possible seed values for the test pattern generator which optimizes the compressed representation of the current seed.

* * * * *